(12) United States Patent
Li et al.

(10) Patent No.: US 11,502,052 B2
(45) Date of Patent: *Nov. 15, 2022

(54) CHIP STRUCTURE (71) Applicant: Novatek Microelectronics Corp., Hsinchu (TW)

(72) Inventors: Ling-Chieh Li, Hsinchu County (TW); Chiao-Ling Huang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 105 days.

This patent is subject to a terminal disclaimer.

(21) Appl. No.: 16/910,085

(22) Filed: Jun. 24, 2020

(65) Prior Publication Data

US 2020/0321300 A1 Oct. 8, 2020

Related U.S. Application Data (63) Continuation of application No. 16/030,864, filed on Jul. 10, 2018, now Pat. No. 10,734,344.

(60) Provisional application No. 62/610,525, filed on Dec. 27, 2017.

(51) Int. Cl.
*H01L 23/48* (2006.01)
*H01L 23/52* (2006.01)
*H01L 29/40* (2006.01)
*H01L 23/00* (2006.01)

(52) U.S. Cl.
CPC .............. *H01L 24/14* (2013.01); *H01L 24/05* (2013.01); *H01L 24/13* (2013.01); *H01L 24/16* (2013.01); *H01L 2224/0401* (2013.01); *H01L 2224/13015* (2013.01); *H01L 2224/1416* (2013.01); *H01L 2224/14051* (2013.01); *H01L 2224/14151* (2013.01); *H01L 2224/16145* (2013.01);

(Continued)

(58) Field of Classification Search
CPC ......... H01L 24/14; H01L 24/05; H01L 24/13; H01L 24/16; H01L 2224/0401; H01L 2224/13015; H01L 2224/14051; H01L 2224/14151; H01L 2224/1416; H01L 2224/16145; H01L 2224/16225; H01L 2224/1426
USPC ......................................................... 257/737
See application file for complete search history.

(56) References Cited

U.S. PATENT DOCUMENTS 9,274,422 B2  3/2016 Minegishi et al.
2009/0301771 A1*  12/2009 Ochi .................... H05K 3/4007
                                                                29/879

(Continued)

FOREIGN PATENT DOCUMENTS

TW   201036114   10/2010
TW   201303498   1/2013

OTHER PUBLICATIONS

"Office Action of Taiwan Counterpart Application", dated Nov. 19, 2020, p. 1-p. 14.

*Primary Examiner* — Calvin Y Choi
(74) *Attorney, Agent, or Firm* — JCIPRNET (57) ABSTRACT A chip structure including a chip body and a plurality of conductive bumps. The chip body includes an active surface and a plurality of bump pads disposed on the active surface. The conductive bumps are disposed on the active surface of the chip body and connected to the bump pads respectively, (Continued)

and at least one of the conductive bumps has a trapezoid shape having one pair of parallel sides and one pair of non-parallel sides.

36 Claims, 4 Drawing Sheets

(52) U.S. Cl.
CPC ............... *H01L 2224/16225* (2013.01); *H01L 2924/1426* (2013.01)

(56) References Cited

U.S. PATENT DOCUMENTS

| | | | |
|---|---|---|---|
| 2010/0109157 A1* | 5/2010 | Lin | H01L 24/05 257/737 |
| 2013/0256878 A1* | 10/2013 | Hsu | H01L 24/08 257/737 |
| 2013/0292821 A1 | 11/2013 | Chi | |
| 2014/0120462 A1 | 5/2014 | Minegishi et al. | |
| 2017/0154930 A1* | 6/2017 | Kim | H01L 27/322 |

* cited by examiner

CHIP STRUCTURE

CROSS-REFERENCE TO RELATED APPLICATION

This is a continuation application of patent application Ser. No. 16/030,864, filed on Jul. 10, 2018, which claims the priority benefit of U.S. provisional application Ser. No. 62/610,525, filed on Dec. 27, 2017, and is now allowed. The entirety of each of the above-mentioned patent applications is hereby incorporated by reference herein and made a part of this specification.

BACKGROUND

Technical Field

The present disclosure generally relates to a semiconductor structure. More particularly, the present disclosure relates to chip structure.

Description of Related Art

Semiconductor devices are progressing toward higher mounting density, higher capacity, and greater miniaturization of each semiconductor chip, in order to meet pressing demands for smaller, multifunctional electronic components. As more functionality has been built into each chip, the number of the bonding pads has increased which increases the size of the chip, resulting in an increase in the manufacturing cost of each semiconductor chip. Costs can be reduced if more bonding pads can be fit per unit length of the semiconductor chip's edge.

There is a limit to decreasing the pitch of bonding pads, i.e. the spacing between neighbouring bonding pads. When the bonding pads have a pitch that is too fine, the accuracy of bonding between the bonding pads and corresponding inner leads is reduced, and electrical defects can occur. Electrical defects include shorts between adjacent bumps of bonding material that connect one inner lead wire to one bonding pad. Electrical defects also include insufficient shear strength of a bump due to insufficient contact area between the bump and the bonding pad. Insufficient shear strength leads to increased chances that the connection between a lead wire and a bonding pad will be broken.

SUMMARY

Accordingly, the present disclosure is directed to a chip structure having higher yield rate owing to higher shear strength of the conductive bumps thereof.

The present disclosure is directed to a chip structure including a chip body and a plurality of conductive bumps. The chip body includes an active surface and a plurality of bump pads disposed on the active surface. The conductive bumps are disposed on the active surface of the chip body and connected to the bump pads respectively, and at least one of the conductive bumps has a trapezoid shape having one pair of parallel sides and one pair of non-parallel sides.

The present disclosure is further directed to a chip structure including a chip body and a plurality of conductive bumps. The chip body includes an active surface and a plurality of bump pads disposed on a bonding portion of the active surface. The conductive bumps are disposed on the bonding portion the active surface and connected to the bump pads respectively. At least one of the conductive bumps includes one pair of parallel sides and one pair of non-parallel sides. Each of the conductive bumps has a long axis, and the long axis of the conductive bumps cross with one another at a plurality of crossing points.

The present disclosure is further directed to a chip structure including a chip body comprising an active surface and a plurality of bump pads disposed on the active surface; a plurality of conductive bumps disposed on the active surface of the chip body and connected to the bump pads respectively, wherein at least one of the conductive bumps has one pair of parallel sides, and one side of the parallel side has a first width and the other side of the parallel side has a second width longer than the first width.

In light of the foregoing, the chip structure of the disclosure may include at least one of the conductive bumps having a trapezoid shape. Each of the conductive bumps can have a long axis, and the long axis of the conductive bumps can cross with one another at a plurality of crossing points. With such an arrangement, contact areas between the conductive bumps and the chip body can be increased, so as to improve the shear strength of the conductive bumps during impacts. Accordingly, reliability and yield rate of the chip structure in the disclosure can be improved, so as to meet fine-pitch requirement.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts. The terms used herein such as "on", "above", "below", "front", "back", "left" and "right" are for the purpose of describing directions in the figures only and are not intended to be limiting of the disclosure. Moreover, in the following embodiments, the same or similar reference numbers denote the same or like components.

Figure 1:
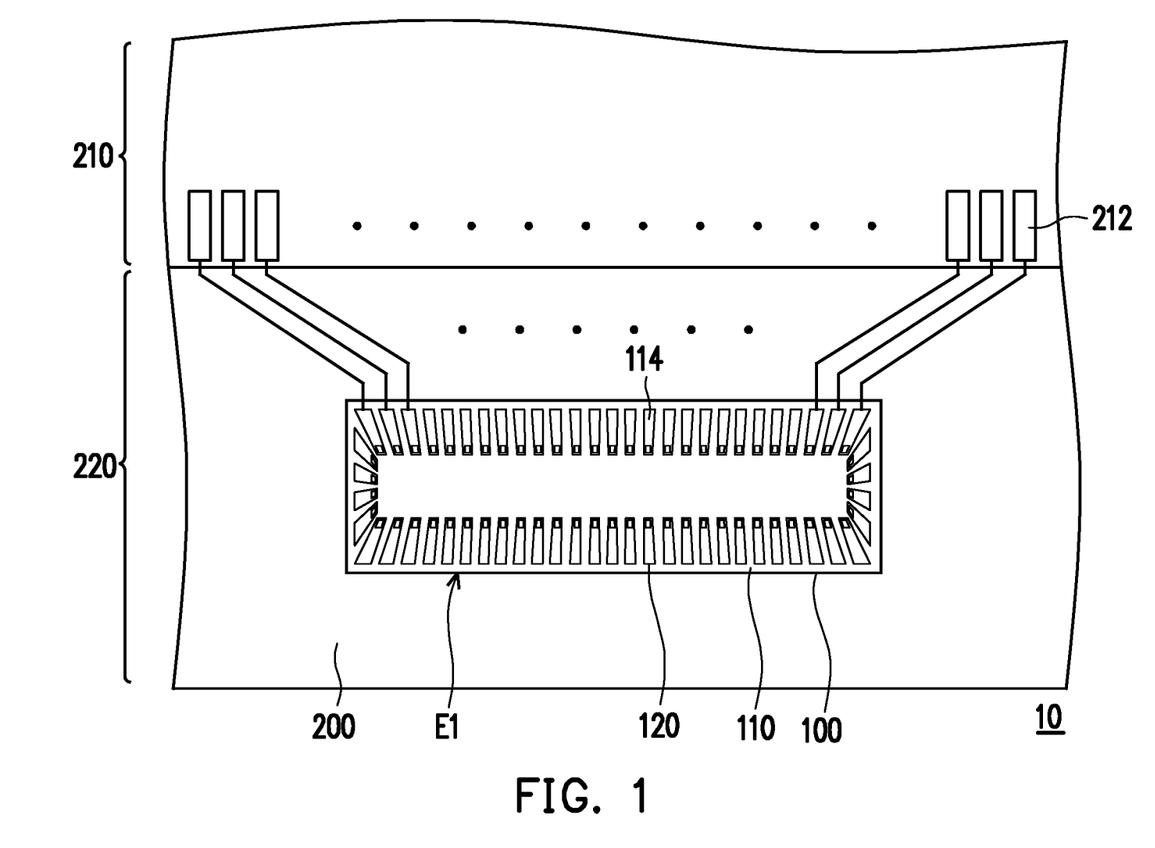
FIG. 1 illustrates a partial top view of a display panel having a chip structure according to an embodiment of the disclosure.
Figure 2:
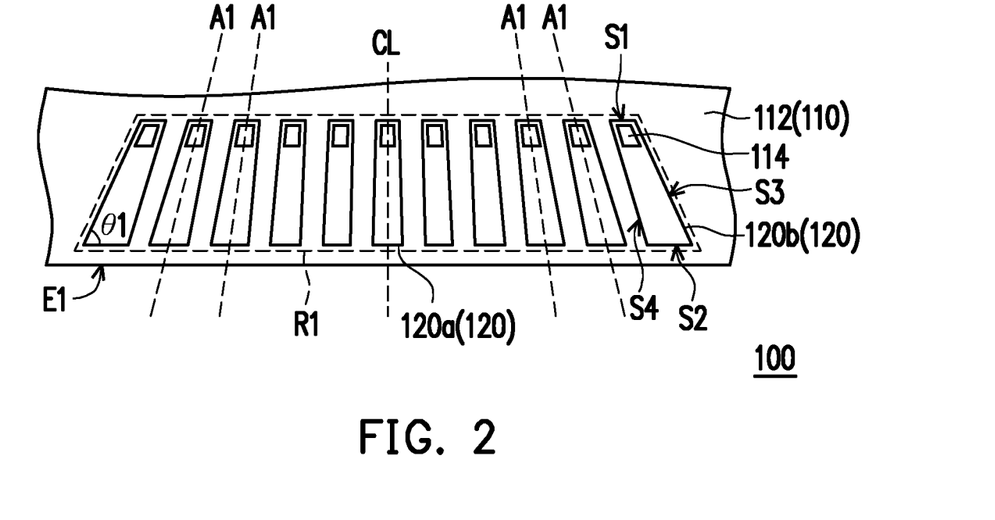
FIG. 2 illustrates a partial enlarged view of a chip structure according to an embodiment of the disclosure.

FIG. 1 illustrates a partial top view of a display panel having a chip structure according to an embodiment of the disclosure. FIG. 2 illustrates a partial enlarged view of a chip structure according to an embodiment of the disclosure. It is noted that the chip body 110 of the chip structure 100 in FIG. 1 is depicted in a perspective manner for illustration purpose. Referring to FIG. 1 and FIG. 2, in the present embodiment, a chip structure 100 includes a chip body 110 and a plurality of conductive bumps 120 which along each side of the chip 110 can be arrange in one or more rows (one row along each side for example as shown). The chip structure 100 of the present embodiment may be applied to a display panel 10 as shown in FIG. 1. For example, the display panel 10 may be a Liquid crystal display (LCD) panel or a Light Emitting Diode (LED) display panel such as an Organic Light Emitting Diode (OLED) display panel, and the disclosure is not limited thereto. In some embodiments, the chip body may include a Si substrate, Ge substrate, GaAs substrate, alumina substrate, zirconia substrate, silicon nitride substrate, glass substrate, ceramic such as silicon carbide substrate, or any other suitable insulating substrate. The chip body 110 includes an active surface 112 and a plurality of bump pads 114 disposed on the active surface 112. The conductive bumps 120 are disposed on the active surface 112 of the chip body 110. In some embodiments, the conductive bumps 120 are connected to the bump pads 114 respectively.

In the present embodiments, the display panel 10 may include a glass substrate 200. The glass substrate 200 includes an active area 210 and a peripheral area 220 connected to a side of the active area 112. In the present embodiment, glass substrate 200 may further include a pixel array 212 and a plurality of fan-out lines. The pixel array 212 is formed by a plurality of pixel electrodes arranged in an array on the active area 210. The peripheral area 220 may be disposed on a side of the active area 210, and the fan-out lines are disposed on the peripheral area 220 for connecting the pixel array 212 and the chip structure 100 as shown in FIG. 1. In some embodiments, the chip structure 100 may be mounted on the peripheral area 220 of the glass substrate 200. In other words, the chip structure 100 may be chip on glass (COG) structure. In some embodiment, the chip structure 100 may be mounted on a substrate through the conductive bumps 120, and the substrate may be a flexible film bonded to the glass substrate 200. In other words, the chip structure 100 may be a chip on film (COF) structure. In other embodiment, the substrate 200 may be a film such as a plastic flexible film, and the chip structure 100 is mounted on the peripheral area 220 of the plastic flexible film through the conductive bumps 120. In other words, the chip structure 100 may be a chip on plastic (COP) structure.

In some embodiment, the chip structure 100 may be a driver IC, which may be mounted on the peripheral area 220 and may include a processor for driving the display panel 10. In the present embodiment, the chip structure 100 may be integrated with at least one passive device such as a resistor, a capacitor, an inductor or any combination thereof. However, the present embodiment is merely for illustration, and the disclosure does not limit the types of the chip structure 100. In other embodiments, the chip structure 100 may be a flash memory chip.

With now reference to FIG. 2, in some embodiments, at least one of the conductive bumps 120 has a trapezoid shape, which has one pair of parallel sides S1, S2 and one pair of non-parallel sides S3, S4. In the present embodiments, each of the conductive bumps 120 has a long axis A1, and the long axes A1 of the conductive bumps 120 cross with one another at a plurality of crossing points (now shown). In other words, the long axes A1 of the conductive bumps are not converged toward one point. Alternatively, the long axes A1 of the conductive bumps may also be converged toward one point. In the present embodiment, each of the parallel sides S1, S2 is shorter than each of the non-parallel sides S3, S4. In some embodiments, gaps (side-to-side distances) between any adjacent two of the conductive bumps 120 are the same, and/or the areas of the conductive bumps 120 may also be the same.

With the arrangement of the conductive bump 120 having a trapezoid shape, contact areas between the conductive bumps 120 and the chip body 110 is increased, so as to improve the shear strength of the conductive bumps 120 during impact. Accordingly, the chip structure with trapezoid conductive bumps can provide great reliability to meet fine-pitch requirement.

In some embodiments, the conductive bumps 120 are symmetrically arranged with respect to a central line CL of a bonding portion R1 where the conductive bumps 120 are disposed. For example, the conductive bumps 120 may include a central conductive bump 120a and a plurality of non-central conductive bumps 120b. The central conductive bump 120a is disposed along the central line CL of the bonding portion R1 where the conductive bumps 120 are disposed. In the present embodiment, the central conductive bump 120a has an isosceles trapezoid shape. In other words, the central conductive bump 120a is symmetric with respect to the central line CL. Each of the non-central conductive bumps 120b may have an obtuse trapezoid shape and located on two sides of the central conductive bump 120a. In some embodiments, the non-central conductive bumps 120b are symmetrically arranged with respect to the central conductive bump 120a.

In some embodiments, each of the conductive bumps 120 has an acute internal angle $\theta 1$ included between one of the parallel sides (e.g. the parallel side S2) and one of the non-parallel sides (e.g. the non-parallel side S4). In the present embodiment, the acute internal angle $\theta 1$ of each of the conductive bumps increases as the acute internal angle $\theta 1$ get closer to the central conductive bump 120a of the conductive bumps 120.

In the present embodiment, the parallel sides S1, S2 of each of the conductive bumps 120 include a short side S1 and a long side S2. The bump pad 114, which is connected to each of the conductive bumps 120, can be arranged to be closer to the short side S1 of each of the conductive bumps 120 than to the long side S2 of each of the conductive bumps 120.

In the present embodiments, the parallel sides S1, S2 of each of the conductive bumps 120 include a short side (e.g. the short side S1) and a long side (e.g. the long side S2). The short side S1 can be located closer to an inner region of the chip body 110, and the long side S2 can be located closer to an outer region of the chip body 110. In other words, the longer side S2 is closer to an outer edge E1 of the chip body 110 as it is shown in FIG. 1 and FIG. 2.

Figure 3:
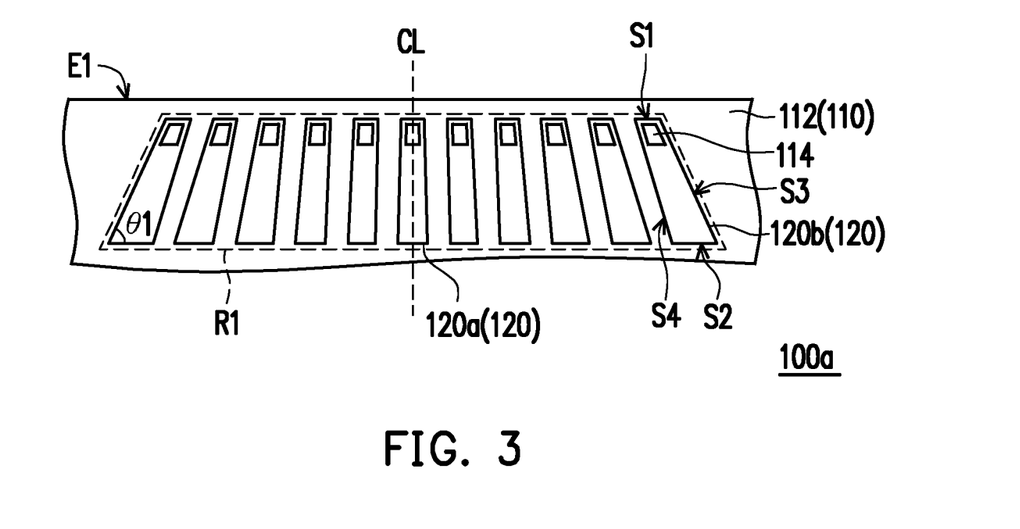
FIG. 3 illustrates a partial enlarged view of a chip structure according to an embodiment of the disclosure.

FIG. 3 illustrates a partial enlarged view of a chip structure according to an embodiment of the disclosure. It is noted that the chip structure 100a shown in FIG. 3 contains many features same as or similar to the chip structure 100 disclosed earlier with FIG. 1 and FIG. 2. For purpose of clarity and simplicity, detail description of same or similar features may be omitted, and the same or similar reference numbers denote the same or like components. The main differences between the chip structure 100a shown in FIG. 3 and the chip structure 100 disclosed earlier with FIG. 1 and FIG. 2 are described as follows.

With now reference to FIG. 3, in the present embodiment, the parallel sides S1, S2 of each of the conductive bumps 120 includes a short side S1 and a long side S2. The short side S1 can be arranged to be closer to an outer region of the chip body 110, and the long side S2 can be arranged to be located closer to an inner region of the chip body 110. In other words, the shorter side S1 is closer to an outer edge E1 of the chip body 110. It is noted that in different embodiments, the short side S1 can be modified to be closer to the inner region of the chip body 110, and the long side S2 can be modified to be located closer to the outer region of the chip body 110.

Figure 4:
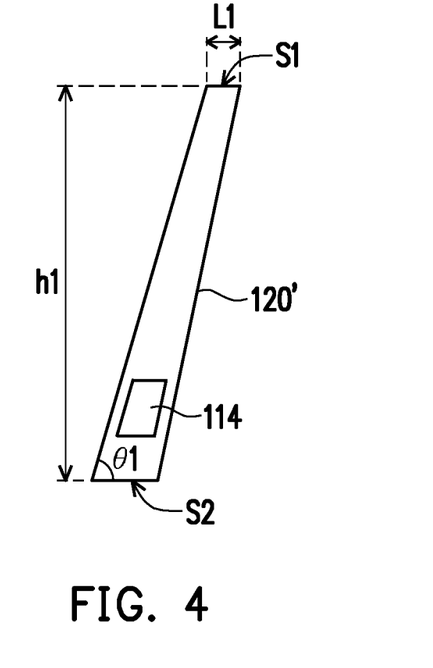
FIG. 4 illustrates a schematic view of a conductive bump of a chip structure according to an embodiment of the disclosure.

FIG. 4 illustrates a schematic view of a conductive bump of a chip structure according to an embodiment of the disclosure. It is noted that the conductive bump 120' shown in FIG. 4 contains many features same as or similar to the conductive bump 120 disclosed earlier with FIG. 2 and FIG. 3. For purpose of clarity and simplicity, detail description of same or similar features may be omitted, and the same or similar reference numbers denote the same or like components. The main differences between the conductive bump 120' shown in FIG. 4 and the conductive bump 120 disclosed earlier with FIG. 2 and FIG. 3 are described as follows.

In the present embodiment, the parallel sides S1, S2 of each of the conductive bumps 120' include a short side S1 and a long side S2. The bump pad 114, which is connected to each of the conductive bumps 120', is closer to the long side S2 of each of the conductive bumps 120' than to the short side S1 of each of the conductive bumps 120'.

In some embodiments, a bump length h1 of one of the conductive bumps 120' may be substantially smaller than or equal to 250 μm. For example, a shortest distance h1 between the parallel sides S1, S2 is substantially smaller than or equal to 252 μm. A bump width L1 of one of the conductive bumps 120' may be substantially greater than or equal to 13 μm. For example, a length L1 of the short side S1 of one of the conductive bump 120 is substantially equal to or greater than 11 μm. A ratio of a shortest distance h1 between the parallel sides S1, S2 to a length L1 of a short side S1 of the parallel sides is substantially equal to or greater than 0.05. A bump area of one of the conductive bumps 120' may be substantially greater than or equal to 195 μm$^2$, and substantially smaller than or equal to 14000 μm$^2$. An acute internal angle θ1 of one of the conductive bumps 120' may be substantially greater than or equal to 30°. A ratio of an area of each of the bump pads 114 to an area of each of the conductive bumps 120 may be substantially greater than or equal to 0 and substantially smaller than or equal to 80%. It is noted that numerical ranges of dimensions with respect to the conductive bump 120' and the bump pad 114 herein can also be applied to other conductive bumps and bump pads disclosed in other embodiments.

Figure 5:
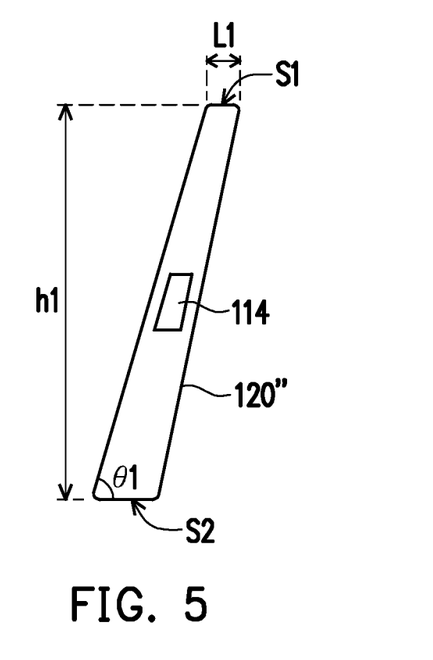
FIG. 5 illustrates a schematic view of a conductive bump of a chip structure according to an embodiment of the disclosure.

FIG. 5 illustrates a schematic view of a conductive bump of a chip structure according to an embodiment of the disclosure. It is noted that the conductive bump 120" shown in FIG. 5 contains many features same as or similar to the conductive bump 120 disclosed earlier with FIG. 2 and FIG. 3. For purpose of clarity and simplicity, detail description of same or similar features may be omitted, and the same or similar reference numbers denote the same or like components. The main differences between the conductive bump 120" shown in FIG. 5 and the conductive bump 120 disclosed earlier with FIG. 2 and FIG. 3 are described as follows.

Referring to FIG. 5, in the present embodiment, the parallel sides S1, S2 of each of the conductive bumps 120" include a short side S1 and a long side S2. The bump pad 114, which is connected to each of the conductive bumps 120" is at the same distance from the long side S2 of each of the conductive bumps 120" as from the short side S1 of each of the conductive bumps 120". In other embodiments, the bump pad 114 can be disposed on any other part of the chip body 110 as long as the bump pad 114 is connected to the corresponding conductive bump 120". In some embodiments, one of the conductive bumps 120 may include a chamfered angle or a smooth corner as it is shown in FIG. 5. In other words, the conductive bump 120 may not have a sharp edges at the corners.

Figure 6:
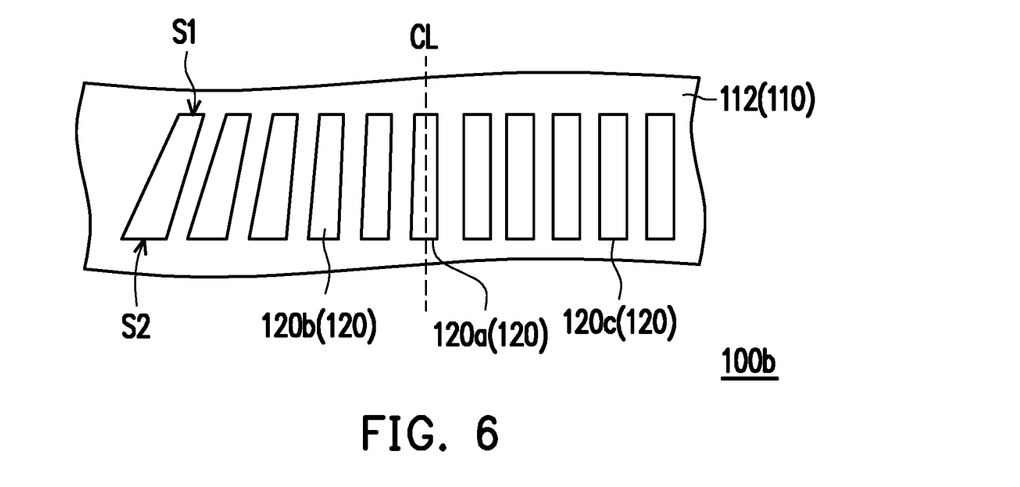
FIG. 6 illustrates a partial enlarged view of a chip structure according to an embodiment of the disclosure.

FIG. 6 illustrates a partial enlarged view of a chip structure according to an embodiment of the disclosure. It is noted that the chip structure 100b shown in FIG. 6 contains many features same as or similar to the chip structure 100 disclosed earlier with FIG. 2. For purpose of clarity and simplicity, detail description of same or similar features may be omitted, and the same or similar reference numbers denote the same or like components. The main differences between the chip structure 100b shown in FIG. 6 and the chip structure 100 disclosed earlier with FIG. 2 are described as follows.

In some embodiments, the conductive bumps 120 are asymmetrically arranged with respect to the central line CL of the bonding portion R1 where the conductive bumps 120 are disposed. For example, the conductive bumps 120 may include a central conductive bump 120a and a plurality of non-central conductive bumps 120b, 120c. The non-central conductive bumps 120b, 120c can be asymmetrically arranged with respect to the central conductive bump 120a. In such an embodiment, gaps (side-to-side distances) between at least adjacent two ones of the conductive bumps 120 may be different from one another, and/or the areas of the conductive bumps 120 may also be different from one another. In some embodiments, the conductive bumps 120 may include at least one additional conductive bump 120c, which can have a trapezoid shape having a first pair of parallel sides and a second pair of parallel sides. For example, the additional conductive bump 120c may have a rectangular shape or a parallelogram shape as shown in FIG. 6. It is noted that the bump pads 114 in FIG. 1 to FIG. 5 are omitted in FIG. 6 to FIG. 7 for purpose of clarity and simplicity.

In some embodiments, different groups of conductive bumps can be arranged, for example, alternately in the same row. In the same or different embodiments, different groups of conductive bumps can be arranged in different rows. In the same or different embodiments, different groups of conductive bumps can be arranged one group by one group in the same row. For example, in some embodiments alternative to FIG. 6, the conductive bumps having trapezoid shapes can be arranged alternatively in the same row with the additional conductive bump having rectangular shapes or parallelogram shapes. In some other embodiments, the conductive bumps having trapezoid shapes can be arranged in one or more first rows and the additional conductive bump having rectangular shapes or parallelogram shapes can be arranged in one or more second rows different from the first row(s).

Figure 7:
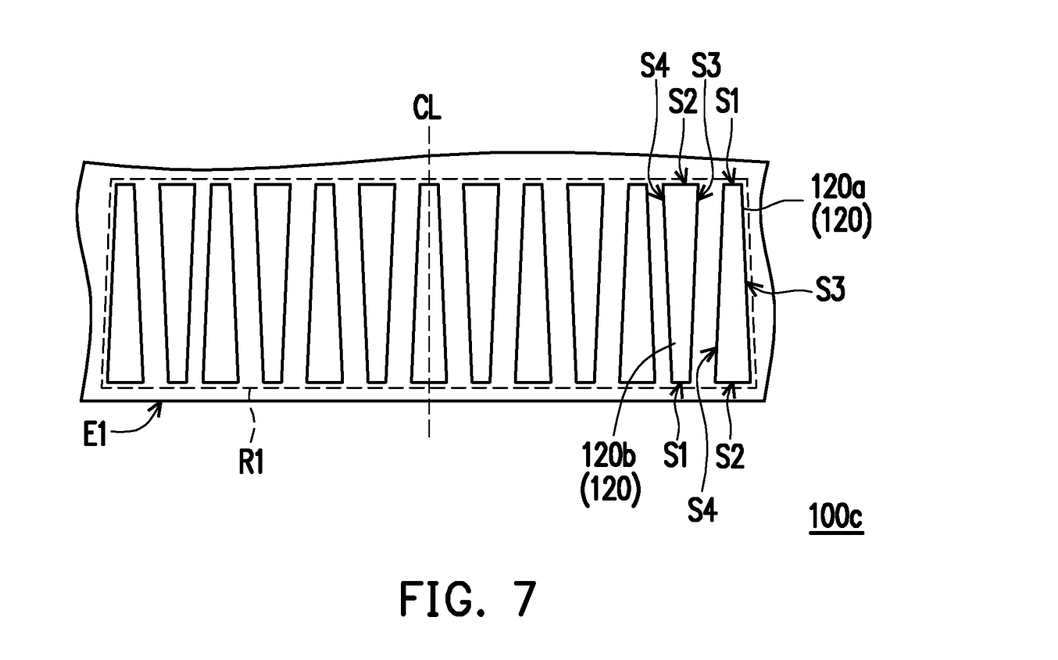
FIG. 7 illustrates a partial enlarged view of a chip structure according to an embodiment of the disclosure.

FIG. 7 illustrates a partial enlarged view of a chip structure according to an embodiment of the disclosure. It is noted that the chip structure 100c shown in FIG. 7 contains many features same as or similar to the chip structure 100 disclosed earlier with FIG. 2. For purpose of clarity and simplicity, detail description of same or similar features may be omitted, and the same or similar reference numbers denote the same or like components. The main differences between the chip structure 100c shown in FIG. 7 and the chip structure 100 disclosed earlier with FIG. 2 are described as follows.

Referring to FIG. 7, the conductive bumps 120 may include a first group including at least one first conductive bump(s) 120a and a second group including at least one second conductive bump(s) 120b, wherein the first conductive bumps 120a and the second conductive bumps 120b can be arranged alternately. In addition, the short/long sides of the parallel sides of the first group of conductive bump can be arranged along a direction the same or different from that of the short/long sides of the parallel sides of the second group of conductive bump. In some exemplary implementations as shown in FIG. 7, the parallel sides S1, S2 of the at least one first conductive bump 120a include a short side S1 and a long side S2. In some embodiments, the short side S1 of the first conductive bump 120a is located closer to an inner region of the chip body 110, and the long side S2 of the first conductive bump 120a is located closer to an outer region (outer edge E1) of the chip body 110. On the other hand, the parallel sides S1, S2 of the second conductive bump 120b include a short side S1 and a long side S2. The short side S1 of the second conductive bump 120b is located closer to the outer region (outer edge E1) of the chip body 110, and the long side S2 of the second conductive bump 120b is located closer to the inner region of the chip body 110. In some other embodiments, the short side S1 and the long side S2 of one or both of at least one of the first conductive bumps and at least one of the second conductive bumps can be modified to be located to be closer to the other different region of the chip body 110. Furthermore, it is noted that in different embodiments, the directions of the short/long sides of the conductive bumps can be alternated regularly (for example alternated one by one as shown in FIG. 7) or irregularly based on design requirements.

It is noted in each of embodiments, sizes, areas, shapes, direction of short/long side and/or pitches of the bumps can be the same or (at least partially) different.

In sum, the chip structure of the disclosure may include at least one of the conductive bumps having a trapezoid shape. Each of the conductive bumps can have a long axis, and the long axis of the conductive bumps can cross with one another at a plurality of crossing points. With such an arrangement, contact areas between the conductive bumps and the chip body can be increased, so as to improve the shear strength of the conductive bumps during impacts. Accordingly, the chip structure with trapezoid conductive bumps can provide great reliability and yield rate to meet fine-pitch requirement.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip structure, comprising:
a chip body comprising an active surface and a plurality of bump pads disposed on the active surface;
a plurality of conductive bumps disposed on the active surface of the chip body and connected to the bump pads respectively, wherein, in a top view toward the active surface, at least one of the conductive bumps has a trapezoid shape having one pair of parallel sides and one pair of non-parallel sides, and each of the conductive bumps has a long axis of symmetry, and the long axes of symmetry of the conductive bumps cross with one another at a plurality of crossing points.

2. The chip structure according to claim 1, wherein each of the parallel sides is shorter than each of the non-parallel sides.

3. The chip structure according to claim 1, wherein the conductive bumps comprise a central conductive bump having an isosceles trapezoid shape.

4. The chip structure according to claim 3, wherein the conductive bumps further comprise a plurality of non-central conductive bumps having an obtuse trapezoid shape and located on two sides of the central conductive bump.

5. The chip structure according to claim 4, wherein the non-central conductive bumps are symmetrically arranged with respect to the central conductive bump.

6. The chip structure according to claim 4, wherein the non-central conductive bumps are asymmetrically arranged with respect to the central conductive bump.

7. The chip structure according to claim 1, wherein the conductive bumps are symmetrically arranged with respect to a central line of a bonding portion where the conductive bumps are disposed.

8. The chip structure according to claim 1, wherein the conductive bumps are asymmetrically arranged with respect to a central line of a bonding portion where the conductive bumps are disposed.

9. The chip structure according to claim 1, wherein each of the conductive bumps has an acute internal angle included between one of the parallel sides and one of the non-parallel sides and the acute internal angle of each of the conductive bumps increases as the acute internal angle get closer to a central conductive bump of the conductive bumps.

10. The chip structure according to claim 1, wherein the parallel sides of each of the conductive bumps comprise a short side and a long side, the bump pad connected to each of the conductive bumps is closer to the short side of each of the conductive bumps than to the long side of each of the conductive bumps.

11. The chip structure according to claim 1, wherein the parallel sides of each of the conductive bumps comprise a short side and a long side, wherein the bump pad connected to each of the conductive bumps is closer to the long side of each of the conductive bumps than to the short side of each of the conductive bumps.

12. The chip structure according to claim 1, wherein the parallel sides of each of the conductive bumps comprise a short side and a long side, wherein the bump pad connected to each of the conductive bumps is at the same distance from the long side of each of the conductive bumps as from the short side of each of the conductive bumps.

13. The chip structure according to claim 1, wherein the parallel sides of each of the conductive bumps comprise a short side and a long side, the short side is closer to an outer region of the chip body, and the long side is located closer to an inner region of the chip body.

14. The chip structure according to claim 1, wherein the parallel sides of each of the conductive bumps comprise a short side and a long side, the short side is located closer to an inner region of the chip body, and the long side is located closer to an outer region of the chip body.

15. The chip structure according to claim 1, wherein the conductive bumps comprises at least one first conductive bumps and at least one second conductive bumps arranged alternately, the parallel sides of the at least one first conductive bump comprise a short side and a long side, the short side of the at least one first conductive bump is located closer to an inner region of the chip body, and the long side of the at least one first conductive bump is located closer to an outer region of the chip body, and the parallel sides of the at least one second conductive bump comprise a short side and a long side, the short side of the at least one second conductive bump is located closer to the outer region of the chip body, and the long side of the at least one second conductive bump is located closer to the inner region of the chip body.

16. The chip structure according to claim 1, wherein the conductive bumps further comprise at least one additional conductive bump, the at least one additional conductive bump has a shape having a first pair of parallel sides and a second parallel sides.

17. The chip structure according to claim 16, wherein the at least one additional conductive bump has a rectangular shape or a parallelogram shape.

18. The chip structure according to claim 1, wherein a shortest distance between the parallel sides is substantially equal to or smaller than 252 µm.

19. The chip structure according to claim 1, wherein the parallel sides comprise a short side and a long side, and a length of the short side is substantially equal to or greater than 11 µm.

20. The chip structure according to claim 1, wherein a ratio of a shortest distance between the parallel sides to a length of a short side of the parallel sides is substantially equal to or greater than 0.05.

21. The chip structure according to claim 1, wherein an area of each of the conductive bumps is substantially equal to or greater than 195 µm² and substantially equal to or smaller than 14000 µm².

22. The chip structure according to claim 1, wherein an acute angle of each of the conductive bumps is substantially equal to or greater than 30°.

23. The chip structure according to claim 1, wherein a ratio of an area of each of the bump pads to an area of each of the conductive bumps is substantially equal to or greater than 0 and substantially equal to or smaller than 80%.

24. The chip structure according to claim 1, wherein the chip structure is mounted on a substrate through the conductive bumps.

25. The chip structure according to claim 24 wherein the substrate is a film and the chip structure is a chip on film (COF) structure.

26. The chip structure according to claim 16, wherein the chip structure is a chip on plastic (COP) structure.

27. The chip structure according to claim 16, wherein the chip structure is a driver IC for driving a display panel.

28. The chip structure according to claim 1, wherein gaps between any adjacent two of the conductive bumps are the same.

29. The chip structure according to claim 1, wherein gaps between at least two adjacent ones of the conductive bumps are different from one another.

30. The chip structure according to claim 1, wherein areas of the conductive bumps are the same.

31. The chip structure according to claim 1, wherein areas of the conductive bumps are different from one another.

32. The chip structure according to claim 1, one of the conductive bumps comprises a chamfered angle.

33. A chip structure, comprising:
a chip body comprising an active surface and a plurality of bump pads disposed on a bonding portion of the active surface;
a plurality of conductive bumps disposed on the bonding portion the active surface and connected to the bump pads respectively, wherein at least one of the conductive bumps comprises one pair of parallel sides and one pair of non-parallel sides, and each of the conductive bumps has a long axis of symmetry, and the long axis of symmetry of the conductive bumps cross with one another at a plurality of crossing points.

34. A chip structure, comprising:
a chip body comprising an active surface and a plurality of bump pads disposed on the active surface;
a plurality of conductive bumps disposed on the active surface of the chip body and connected to the bump pads respectively, wherein in a top view toward the active surface, each of the conductive bumps has an acute internal angle included between one of the parallel sides and one of the non-parallel sides and the acute internal angle of each of the conductive bumps increases as the acute internal angle get closer to a central conductive bump of the conductive bumps.

35. The chip structure according to claim 34, wherein each of the conductive bumps has a long axis, and the long axis of the conductive bumps cross with one another at a plurality of crossing points.

36. The chip structure according to claim 34, wherein at least one of the conductive bumps has a trapezoid shape.

* * * * *